United States Patent
Misumi et al.

(10) Patent No.: US 6,737,733 B2
(45) Date of Patent: May 18, 2004

(54) SEALED SEMICONDUCTOR DEVICE AND LEAD FRAME USED FOR THE SAME

(75) Inventors: Kazuyuki Misumi, Tokyo (JP); Kazunari Michii, Tokyo (JP); Yoshihiro Hirata, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 09/848,256

(22) Filed: May 4, 2001

(65) Prior Publication Data

US 2002/0070431 A1 Jun. 13, 2002

(30) Foreign Application Priority Data

Dec. 8, 2000 (JP) ......................................... 2000-374113

(51) Int. Cl.[7] ............................................. H01L 23/495
(52) U.S. Cl. ........................ 257/666; 257/676; 257/696; 257/787
(58) Field of Search ................................ 257/666, 676, 257/674, 678, 696, 701, 787

(56) References Cited

U.S. PATENT DOCUMENTS

| 5,198,883 A | * | 3/1993 | Takahashi et al. | .......... 257/676 |
| 5,334,803 A | * | 8/1994 | Yamamura et al. | ........ 174/52.4 |
| 5,358,906 A | * | 10/1994 | Lee | .............. 437/217 |
| 5,535,509 A | * | 7/1996 | Tomita et al. | ................ 29/827 |
| 5,612,569 A | * | 3/1997 | Murakami et al. | .......... 257/666 |
| 5,834,691 A | * | 11/1998 | Aoki | ......................... 174/52.4 |
| 5,939,775 A | | 8/1999 | Bucci et al. | |
| 6,060,770 A | * | 5/2000 | Nakamura et al. | .......... 257/668 |
| 6,072,228 A | * | 6/2000 | Hinkle et al. | ............... 257/666 |
| 6,211,573 B1 | * | 4/2001 | Ichinose | .................... 257/676 |

FOREIGN PATENT DOCUMENTS

| JP | 5-343445 | 12/1993 |
| JP | 5-347374 | 12/1993 |
| JP | 6-169052 | 6/1994 |
| JP | 06-188353 | 7/1994 |
| JP | 06-188354 | 7/1994 |

* cited by examiner

Primary Examiner—Luan Thai
(74) Attorney, Agent, or Firm—Leydig, Voit & Mayer, Ltd.

(57) ABSTRACT

In an LOC semiconductor device, a semiconductor chip is fixed on a die pad through a die pad material. A lead including an internal lead extending to the vicinity of a pad provided to the semiconductor chip is put in place. A tape member is placed at positions corresponding to four corners of the semiconductor chip between the internal lead and the semiconductor chip. The tape member is bonded and fixed only to the internal lead but it is not bonded or fixed to the semiconductor chip and merely contacts the surface of the semiconductor chip.

10 Claims, 18 Drawing Sheets

2b,2c

SEALED SEMICONDUCTOR DEVICE AND LEAD FRAME USED FOR THE SAME

BACKGROUND OF THE INVENTION

1. Field of the Invention

The present invention relates to a sealed semiconductor device and a lead frame used for the sealed semiconductor device, particularly to a sealed semiconductor device holding the interval between an internal lead and a semiconductor chip almost constant and a lead frame used for the sealed semiconductor device.

2. Description of the Background Art

An LOC (Lead On Chip) semiconductor device is described below as an example of conventional sealed semiconductor device obtained by sealing a semiconductor chip with a resin. In the LOC semiconductor device, a pad is formed nearby the center of a semiconductor chip and an internal lead extending to the vicinity of the pad is provided. Therefore, the LOC semiconductor device has an advantage that a larger semiconductor chip can be mounted compared to a structure of bonding a wire to a lead located at the side face of the semiconductor chip.

As shown in FIG. 28, in the case of an LOC semiconductor device, a semiconductor chip 101 is fixed on a die pad 103 through a die pad material 104. A lead 102 which includes an internal lead 102a extends to the vicinity of a pad (not illustrated) on the semiconductor chip 101. The tip end of the internal lead 102a and the pad are wire-bonded by a gold wire 105. Then, the semiconductor chip 101 and the internal lead 102a are sealed with a molded resin 106.

In the case of this LOC semiconductor device, however, as shown in FIG. 29, when setting the semiconductor chip 101 and internal lead 102a in a mold and sealing them with the mold resin 106, the semiconductor chip 101 maybe shifted toward the internal lead 102a due to the difference in flow resistance between a mold resin 106a flowing by the upper side of the semiconductor chip 101 and a mold resin 106b flowing by the lower side of the semiconductor chip 101.

Therefore, the internal lead 102a and the surface of the semiconductor chip 101 are excessively close each other, the capacitance between them fluctuates, and thereby timing of an input signal and an output signal may be shifted.

As the LOC semiconductor device for preventing the internal lead 102a and the surface of the semiconductor chip 101 from being close each other when sealed by a mold resin, there is an LOC semiconductor device disclosed in Japanese Patent Laying-Open No. 6-169052. In the case of the LOC semiconductor device, an insulating layer 107 is formed between a semiconductor chip 101 and an internal lead 102a as shown in FIG. 30.

The insulating layer 107 is continuously formed along the direction in which the internal leads 102a are arranged (direction almost orthogonal to the paper surface) so as to be present between every internal lead 102a and the semiconductor chip 101. The gaps between each internal lead 102a and the insulating layer 107 and between the insulating layer 107 and the semiconductor chip 101 are fixed by an adhesive.

According to the LOC semiconductor device, the semiconductor chip 101 is not shifted toward the internal lead 102a when sealed by a mold resin because the insulating layer 107 is formed between the semiconductor chip 101 and the internal lead 102a.

Thereby, fluctuation of the capacitance between the internal lead 102a and the surface of the semiconductor chip 101 because the leads are excessively close each other is prevented and it is possible to control the shift of timing between an input signal and an output signal.

However, the LOC semiconductor device disclosed in Japanese Patent Laying-Open No. 6-169052 has the following problem. In the case of this LOC semiconductor device, to bond the insulating material 107 with the semiconductor chip 101, it is necessary to press the internal lead 102a against the semiconductor chip 101 from the upper side at an temperature of 150 to 200° C. or press the semiconductor chip 101 against the internal lead 102a from the upper side by vertically reversing the internal lead 102a and the semiconductor chip 101.

Therefore, a production system for pressing the internal lead 102a or semiconductor chip 101 is necessary and thereby, the production cost may increase.

Moreover, though the insulating material 107 generally uses a resin film, the resin film generally has a high hygroscopicity. The moisture absorbed in the insulating material 107 is evaporated due to heat when mounting a semiconductor device sealed by the resin on a substrate. In this case, cracks may occur on the mold resin 106.

Particularly, the insulating layer 107 absorbs much moisture because the layer 107 is continuously formed along the direction in which internal leads 102a are arranged (direction almost perpendicular to the paper surface) and has a comparatively large contact area with the internal leads 102a and semiconductor chip 101. Therefore, when the moisture is evaporated, cracks tend to more easily occur in the mold resin 106.

SUMMARY OF THE INVENTION

The present invention is made to solve the above problems, and it is an object of the present invention to provide a sealed semiconductor device capable of easily preventing an internal lead and a semiconductor chip from being excessively close each other without using any additional production system when the device is sealed by a mold resin and controlling cracks from being generated on the mold resin due to the heat when the device is set to a substrate and the like and it is another object to provide a lead frame used for the sealed semiconductor device.

A sealed semiconductor device according to an aspect of the present invention is a sealed semiconductor device having a semiconductor chip portion and a lead frame portion including an internal lead portion extending onto the surface of the semiconductor chip portion and moreover having a holding member for holding the semiconductor chip portion and the internal lead portion at a predetermined interval by being fixed to either of the semiconductor chip portion and internal lead portion and contacting the other without being fixed.

According to the above sealed semiconductor device, it is possible to comparatively easily prevent an internal lead portion and a semiconductor chip portion from excessively close together when sealed by a mold resin without using an additional system for fixing a holding member to the semiconductor chip portion and internal lead portion, compared to the case of a conventional sealed semiconductor device because the holding member is fixed to either of the semiconductor chip portion and internal lead portion and contacts the other without being fixed.

It is preferable that the above holding member includes a tape member bonded and fixed to the internal lead portion and particularly preferable that the tape member is set in areas around the semiconductor chip portion.

In this case, because the contact area between the tape member and semiconductor chip portion is greatly decreased compared to the case of a conventional sealed semiconductor device, the quantity of moisture to be absorbed by the tape member is also reduced. Thereby, it is possible to control cracks from being generated on a mold resin in accordance with evaporation of moisture.

It is preferable that the holding member includes a first protrusion protruding toward the semiconductor chip portion provided to the internal lead portion and particularly preferable that the first protrusion is formed by bending the internal lead portion.

In this case, it is possible to prevent the internal lead portion and semiconductor chip portion from being excessively close each other by bending the internal lead portion without using an additional member.

It is more preferable that the crest portion of an internal lead contacts the semiconductor chip portion because the lead is bent.

In this case, it is possible to control damages from occurring on the surface of the semiconductor chip.

Moreover, it is preferable that the internal lead portion includes an original internal lead and a dummy internal lead electrically connected with the semiconductor chip portion and its first protrusion is formed in the dummy internal lead.

When the first protrusion is formed on the original internal lead, the first protrusion damages the surface of the semiconductor chip portion when wire-bonding is carried out. However, it is possible to prevent the damage by forming the first protrusion on the dummy internal lead on which wire-bonding is not carried out.

It is preferable that the semiconductor chip portion is almost rectangular, the original internal lead is set toward a pad portion formed nearby the center of the almost-rectangular semiconductor chip portion from a pair of faced sides of the semiconductor chip portion, the dummy internal lead is set toward the semiconductor chip portion from another pair of sides facing the direction almost orthogonal to the pair of faced sides.

In this case, because dummy internal leads are arranged as a lead frame used for a sealed semiconductor device separately from a series of patterns of original internal leads, it is controlled that the pattern of original internal leads is restricted by the pattern of dummy internal leads.

It is more preferable that the first protrusion contacts an area around the semiconductor chip portion.

In this case, it is possible to control damages to the semiconductor chip portion.

It is still more preferable that the semiconductor chip portion includes a semiconductor chip body and a die pad for mounting the semiconductor chip body and the first protrusion contacts the die pad.

In this case, it is possible to completely eliminate damages to the semiconductor chip portion.

It is still more preferable that the semiconductor chip portion includes a semiconductor chip body and a die pad for mounting the semiconductor chip body and a holding member includes a second protrusion fixed to the die pad and protruding toward the internal lead portion.

Also in this case, it is possible to prevent the semiconductor chip portion and internal lead portion from being excessively close each other without damaging the semiconductor chip portion.

It is still more preferable that the holding member is at least located at the opposite side to the injection port of the mold resin when sealing the semiconductor chip portion and internal lead portion with the mold resin.

In this case, it is possible to stably receive the force for the mold resin flowing through the opposite side to the side where internal leads of the semiconductor chip portion are arranged to press the semiconductor chip against the side where internal leads are arranged by setting the holding member to a portion to be most displaced by the force.

A lead frame according to another aspect of the present invention is a lead frame used for a sealed semiconductor device obtained by sealing the above semiconductor chip portion with a mold resin, which is provided with an internal lead portion and a holding lead portion. The internal lead portion is set toward a pad portion formed nearby the center of the semiconductor chip portion and electrically connected with the pad portion. The holding lead portion holds the semiconductor chip portion and the internal lead at a predetermined interval by contacting the semiconductor chip portion.

The lead frame makes it possible to easily prevent the semiconductor chip portion from being excessively close to the internal lead due to the flow of a mold resin when injecting the mold resin by the holding lead portion without using any additional member.

It is preferable that the holding lead portion includes the internal lead portion and a tape member is bonded and fixed to a position of the holding lead portion corresponding to the area around the semiconductor chip portion.

In this case, because the contact area between the tape member and the semiconductor chip portion is greatly decreased, the quantity of moisture to be absorbed by the tape member is also reduced. Thereby, it is possible to control cracks from being generated on the mold resin due to evaporation of the moisture after sealing with the mold resin.

It is more preferable that the holding lead portion is a dummy internal lead portion.

In this case, because dummy internal leads are not wire-bonded, it is possible to prevent the semiconductor chip portion from being damaged.

It is still more preferable that internal leads are arranged toward a pad portion formed nearby the almost-rectangular semiconductor chip portion from a pair of faced sides of the almost-rectangular semiconductor chip portion and the holding lead portion is set toward the semiconductor chip portion from another pair of sides facing the direction almost orthogonal to the pair of faced sides.

In this case, because dummy internal leads are arranged separately form a series of patterns of original internal leads, it is controlled that patterns of the original internal leads are restricted by patterns of dummy internal leads.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
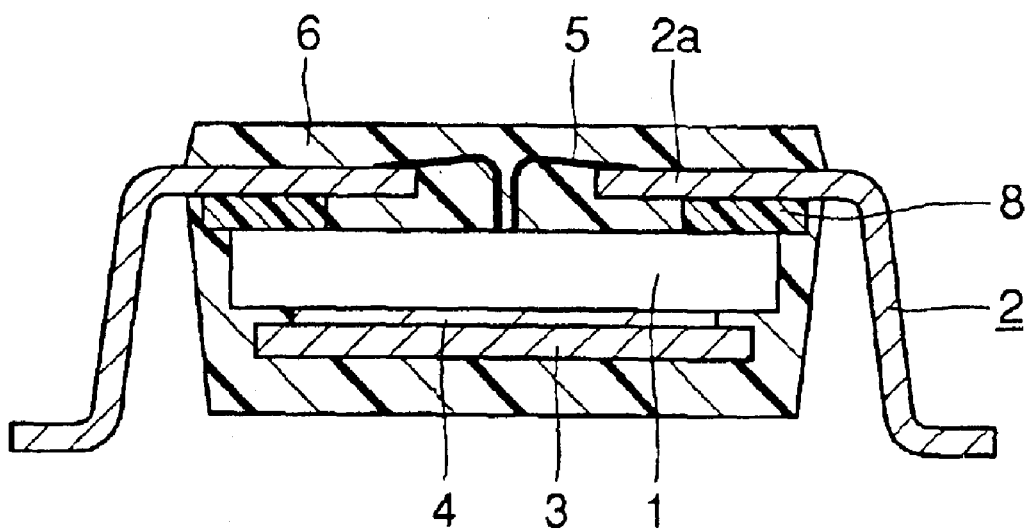
FIG. 1 is a sectional view of an LOC semiconductor device of a first embodiment of the present invention.

The LOC sealed semiconductor device of the first embodiment of the present invention is described below. As shown in FIG. 1, in the case of the LOC semiconductor device, a semiconductor chip 1 is fixed on a die pad 3 through a die pad material 4. A lead 2 is provided which includes an internal lead 2a extending up to the vicinity of a pad 9 (referring to FIG. 2) provided to the semiconductor chip 1. The tip end of the internal lead 2a and pad 9 are wire-bonded each other by a gold line 5.

Figure 2:
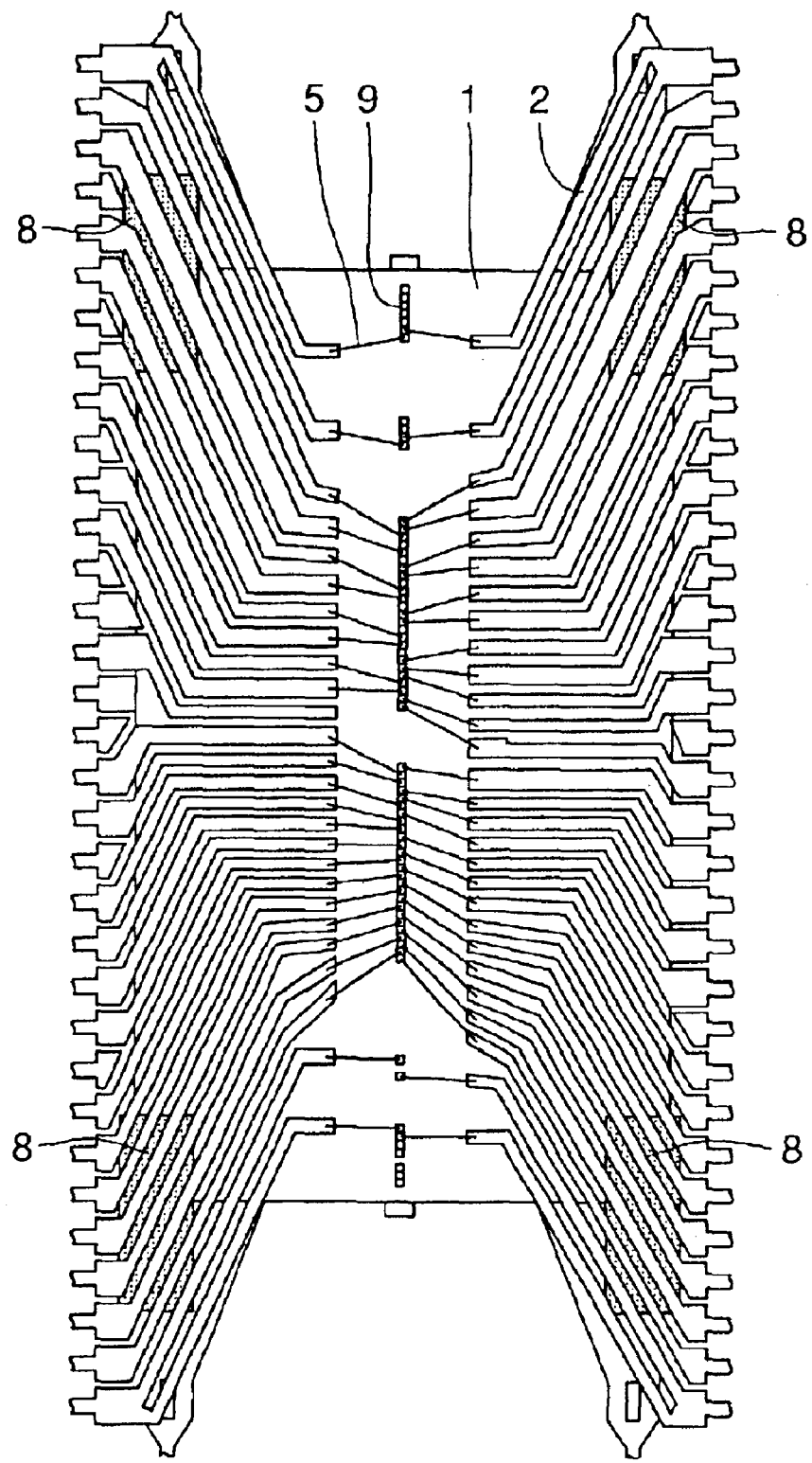
FIG. 2 is an illustration showing a planar pattern of leads used for the LOC semiconductor device of the first embodiment.

A tape member 8 is set between the internal lead 2a and the semiconductor chip 1. The tape member 8 is bonded and fixed only to the internal lead 2a but it is not bonded or fixed to a semiconductor chip 1 and it only contacts the surface of the semiconductor chip 1. Moreover, the tape members 8 are set so as to be located at four corners of the semiconductor chip 1 one each as shown in FIG. 2. Furthermore, the semiconductor chip 1 and internal lead 2a are sealed with a mold resin 6.

Figure 3:
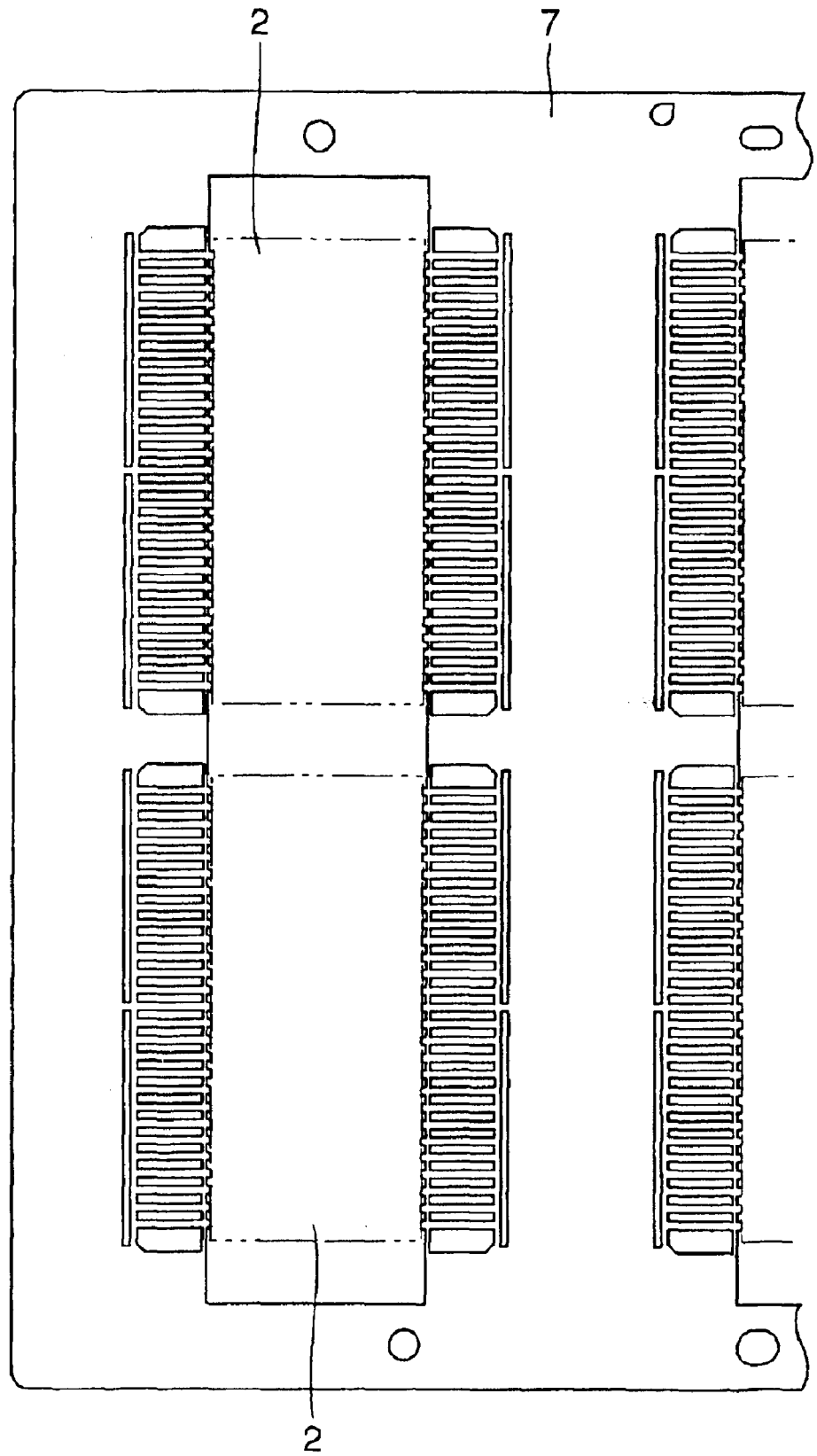
FIG. 3 is a top view showing a lead frame including the leads shown in FIG. 2 of the first embodiment.

The lead 2 is obtained from a lead frame 7 formed by punching a metal plate (sheet material) made of a predetermined alloy as shown in FIG. 3.

Figure 4:
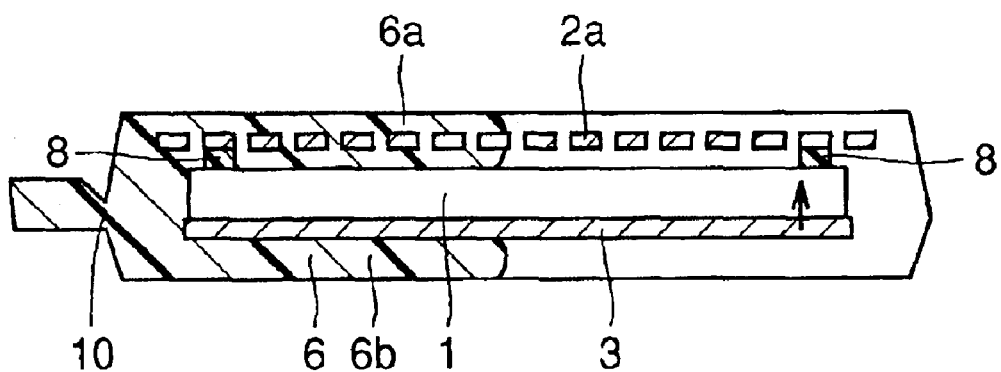
FIG. 4 is a sectional view showing a step of injecting a mold resin into a mold.

In the case of this LOC semiconductor device, a force for shifting the semiconductor chip 1 toward the internal lead 2a may act because the difference in flow resistance is generated between a mold resin 6a flowing through the upper side of the semiconductor chip 1 and a mold resin 6b flowing through the lower side of the semiconductor chip 1 when sealing the semiconductor chip 1 and internal lead 2a with the mold resin 6 as shown in FIG. 4. However, because the tape member 8 is set between the internal lead 2a and the semiconductor chip 1, it is possible to prevent the semiconductor chip 1 from approaching the internal lead 2a.

In this case, it is preferable to use a structure to make the flow of the mold resin 6b at the lower side of the semiconductor chip 1 higher than the flow of the mold resin 6a at the upper side of the semiconductor chip 1 so that a force to shift the semiconductor chip 1 toward the internal lead 2a acts in order to prevent the semiconductor chip 1 from shifting in the direction going away from the internal lead 2a when injecting a mold resin into a mold.

Figure 5:
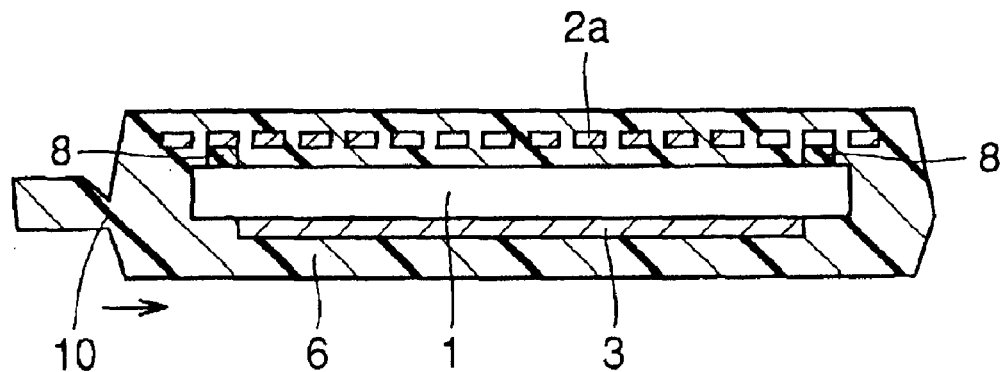
FIG. 5 is an illustration showing a step to be executed after the step shown in FIG. 4 of the first embodiment.

Thereby, as shown in FIG. 5, after the mold resin is completely injected into the mold, the interval between the semiconductor chip 1 and the internal lead 2a is kept, and it is prevented that the semiconductor chip 1 and internal lead 2a are excessively close each other. As a result, it is possible to control the shift of timing between input and output signals caused by fluctuation of the capacity between the semiconductor chip 1 and the internal lead 2a.

Moreover, in the case of this LOC semiconductor device, the tape member 8 for holding the interval between the semiconductor chip 1 and the internal lead 2a is set to positions corresponding to four corners of the semiconductor chip 1 respectively as shown in FIG. 2. Therefore, the area in which the tape member 8 is set is greatly reduced compared to the structure of a conventional LOC semiconductor device in which an insulating layer is continuously formed along the direction in which internal leads are arranged.

Thereby, the quantity of moisture to be absorbed by the tape member 8 is greatly reduced. Moreover, contact areas between the tape member 8, internal lead 2a, and semiconductor chip 1 are decreased. As a result, the quantity of moisture to be evaporated due to the heat conducting through the lead 2 is inevitably decreased when setting a resin-sealed LOC semiconductor device to a substrate and the like and it is possible to securely control cracks from being generated on the mold resin 6.

Moreover, because the tape member 8 is only bonded and fixed to an internal lead and it is unnecessary to bond the tape member 8 to the semiconductor chip 1, a system for bonding a tape member to the semiconductor chip 1 is also unnecessary by using a lead frame to which a tape member is previously bonded.

In the case of the above LOC semiconductor device, the tape member 8 is set to four corners of the semiconductor chip 1 respectively. However, because a force to shift the semiconductor chip 1 toward an internal lead generated when injecting the mold resin 6 into a mold tends to act on the portion of the semiconductor chip 1 at the opposite side to an injection port for injecting a mold resin, it is possible to hold the interval between the internal lead 2a and the semiconductor chip 1 by setting the tape member 8 to at least one place most separate from an injection gate 10.

Second Embodiment

Figure 6:
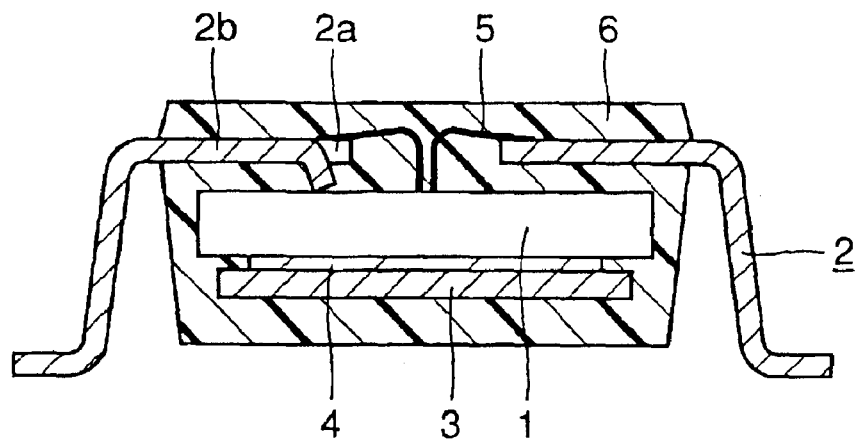
FIG. 6 is a sectional view of an LOC semiconductor device of a second embodiment of the present invention.
Figure 7:
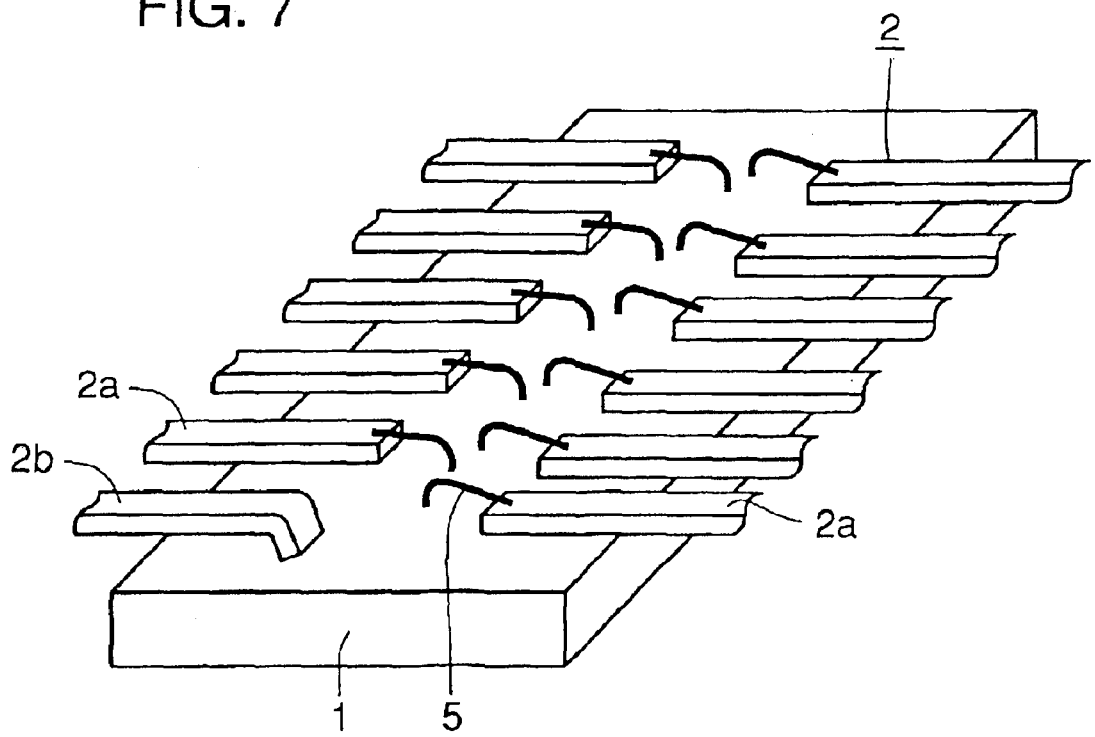
FIG. 7 is a partial perspective view of the LOC semiconductor device shown in FIG. 6 of the second embodiment.

The LOC semiconductor device of the second embodiment of the present invention and a lead frame used for the device are described below. As shown in FIGS. 6 and 7, in the case of this LOC semiconductor device, a lead 2 has a lead 2b on which a bent portion contacting the surface of a semiconductor chip 1 is formed. Because other configurations are the same as those of the LOC semiconductor device described for the first embodiment shown in FIG. 1, the same member is provided with the same symbol and its description is omitted.

The tip end of the lead 2b is bent toward the semiconductor chip 1 and contacts with the surface of the semiconductor chip 1 so that the interval between the internal lead 2a and the semiconductor chip 1 is kept in a range of 60 to 120 $\mu$m. Moreover, the lead 2b is set to a position opposite to an injection port for injecting a mold resin into a mold when the lead 2b is sealed with the mold resin.

As described for the first embodiment, the portion of a semiconductor chip 1 opposite to the injection port for injecting a mold resin is most greatly displaced by the force to shift the semiconductor chip 1 toward the internal lead 2a generated when injecting the mold resin 6 into a mold.

According to this LOC semiconductor device, it is possible to effectively prevent the semiconductor chip 1 from approaching the internal lead 2a because the tip end of the internal lead 2b contacts with the surface of the semiconductor chip 1 and, moreover, the internal lead 2b is set to the opposite side to the injection port for injecting a mold resin.

Also in this case, it is preferable to use a structure for making the flow of a mold resin at the lower side of the semiconductor chip 1 higher than the flow of the mold resin at the upper side of the semiconductor chip 1 so that a force to shift the semiconductor chip 1 toward the internal lead 2a acts in order to prevent the semiconductor chip 1 from shifting in the direction going away from the internal lead 2a.

Moreover, in the case of this LOC semiconductor device, the interval between the semiconductor chip 1 and internal lead 2a is kept by a lead. Therefore, compared to the case of the LOC semiconductor device described for the first embodiment, moisture is hardly evaporated due to the heat conducting through the lead 2 when setting the LOC semiconductor device to a substrate and no crack is generated on the mold resin 6 because a tape member having hygroscopicity is not used.

Figure 8:
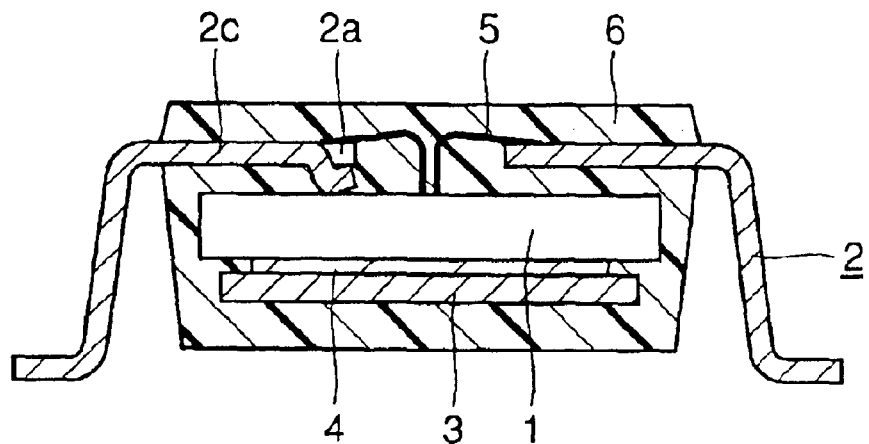
FIG. 8 is a sectional view of an LOC semiconductor device of a first modification of the second embodiment.
Figure 9:
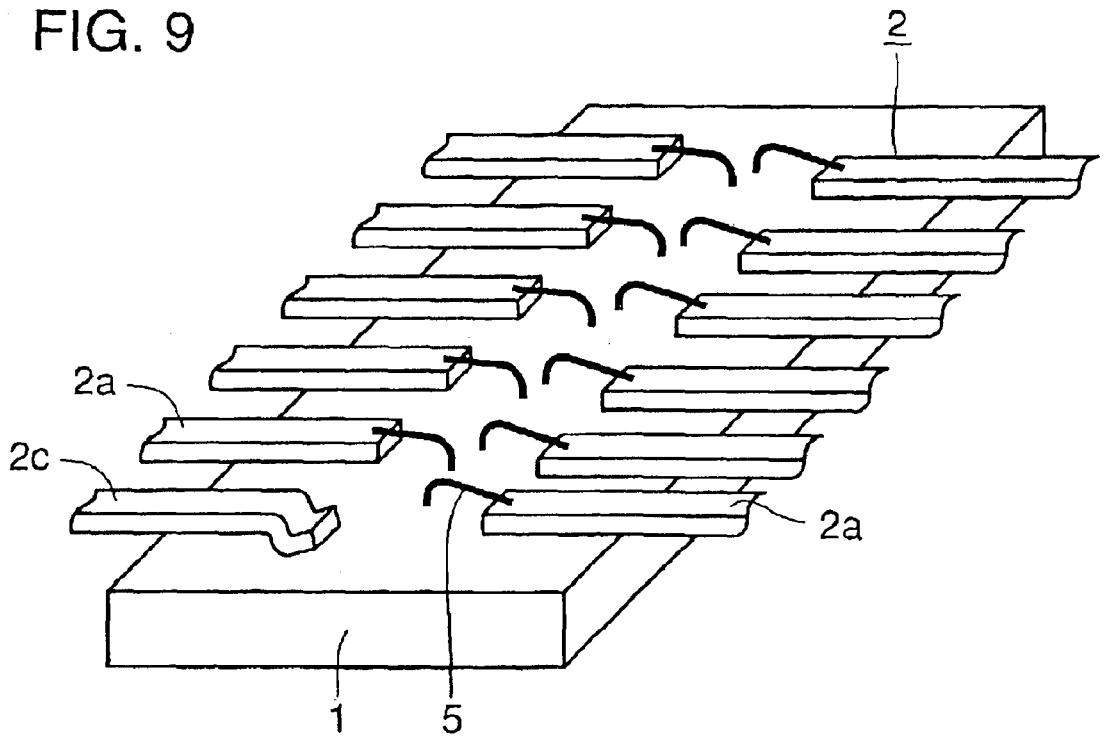
FIG. 9 is a partial perspective view of the LOC semiconductor device shown in FIG. 8 of the second embodiment.

Then, the first modification of the LOC semiconductor device of this embodiment is described below. As shown in FIGS. 8 and 9, in the case of the LOC semiconductor device of the first modification, an internal lead 2c is set which is once bent toward the surface of the semiconductor chip 1 and the tip end of the bent portion is further bent upward.

According to the LOC semiconductor device, the crest portion of the bent internal lead 2c contacts with the surface of the semiconductor chip 1. Therefore, it is possible to control the surface of the semiconductor chip 1 from being damaged compared to the case of the internal lead 2b which is merely bent toward the surface of the semiconductor chip 1 and whose tip end contacts with the surface of the semiconductor chip 1.

Figure 10:
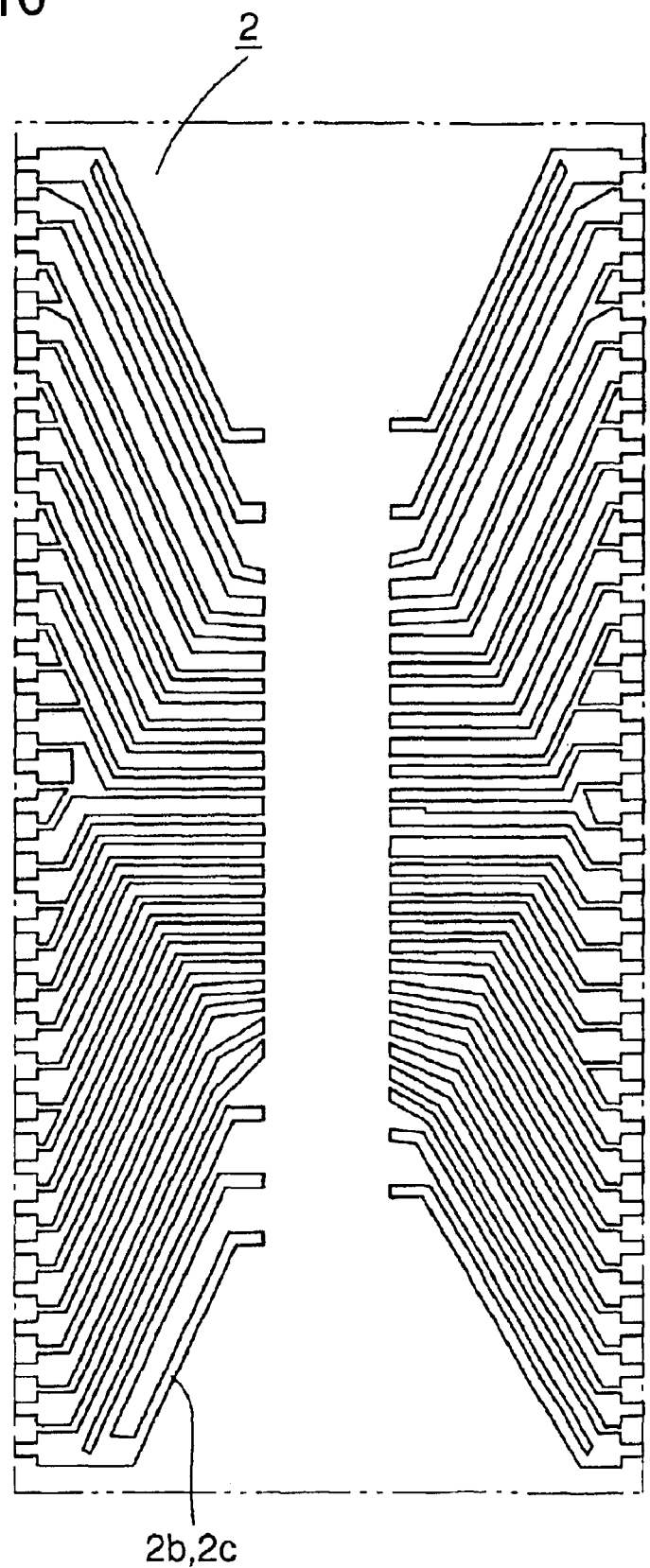
FIG. 10 is an illustration showing a planar pattern of leads used for the LOC semiconductor device of the second embodiment.

It is preferable that these internal leads 2b and 2c are dummy internal leads different from an original internal lead to be wire-bonded. FIG. 10 shows an example of a planar structure of a lead 2 provided with these dummy internal leads 2b and 2c. As shown in FIG. 10, the dummy internal leads 2b and 2c are set to the outermost side.

Figure 11:
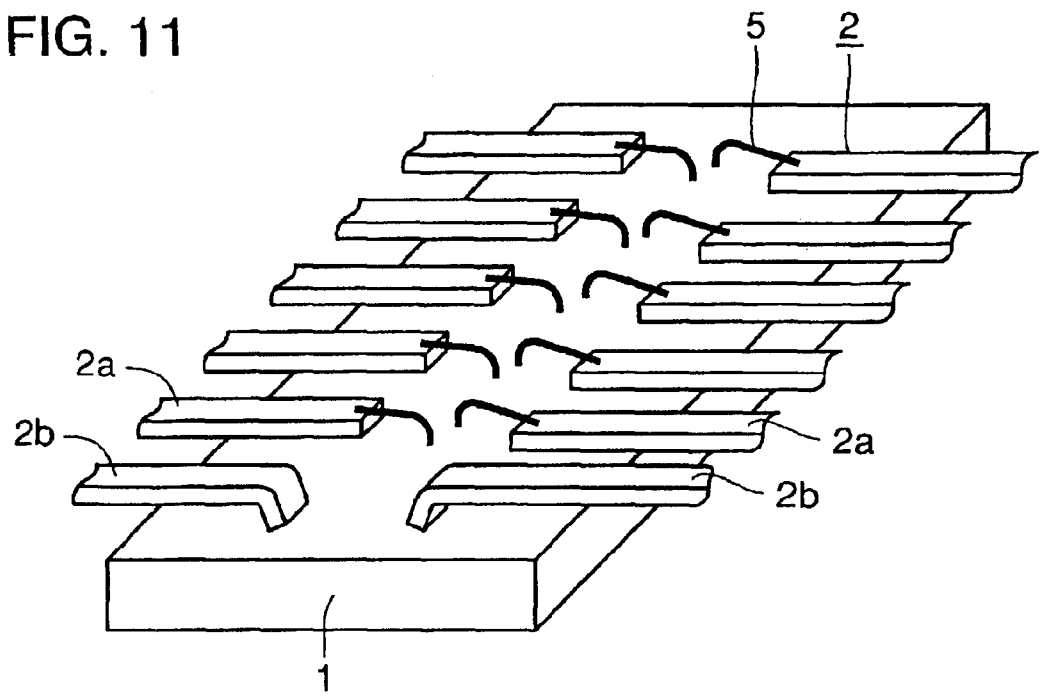
FIG. 11 is a partial perspective view of an LOC semiconductor device of a second modification in the second embodiment.

Then, the second modification of the LOC semiconductor device of this embodiment is described below. As shown in FIG. 11, the LOC semiconductor device of the second modification has two internal leads 2b shown in FIGS. 6 and 7 and the two internal leads 2b are set to faced positions at the both sides of a pad (not illustrated) provided to the semiconductor chip 1.

Figure 12:
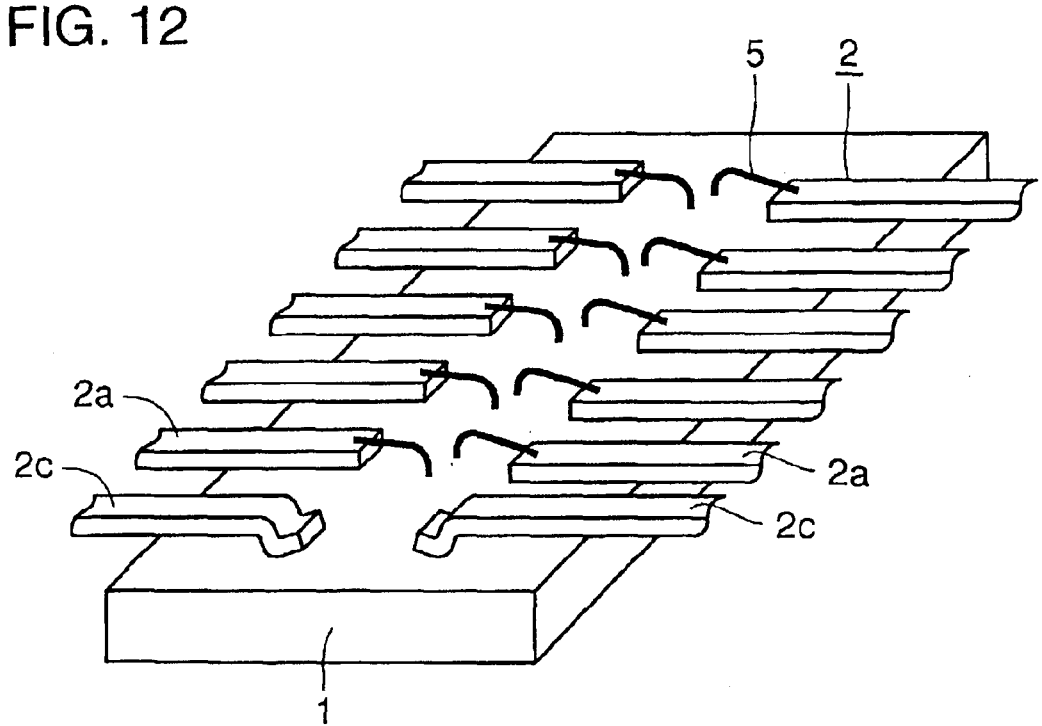
FIG. 12 is a partial perspective view of an LOC semiconductor device of a third modification in the second embodiment.

Similarly, the LOC semiconductor device of the third modification of this embodiment has two internal leads 2c shown in FIGS. 8 and 9 as shown in FIG. 12 and the internal leads 2c are set to faced positions at the both sides of a pad (not illustrated) provided to the semiconductor chip 1.

Thus, in the case of the LOC semiconductor devices of the second and third modifications, two internal leads contacting with the surface of the semiconductor chip 1 are set. Thereby, compared to the case in which one internal lead is used, it is possible to more securely prevent the semiconductor chip 1 from approaching the internal lead 2a when injecting a mold resin.

Figure 13:
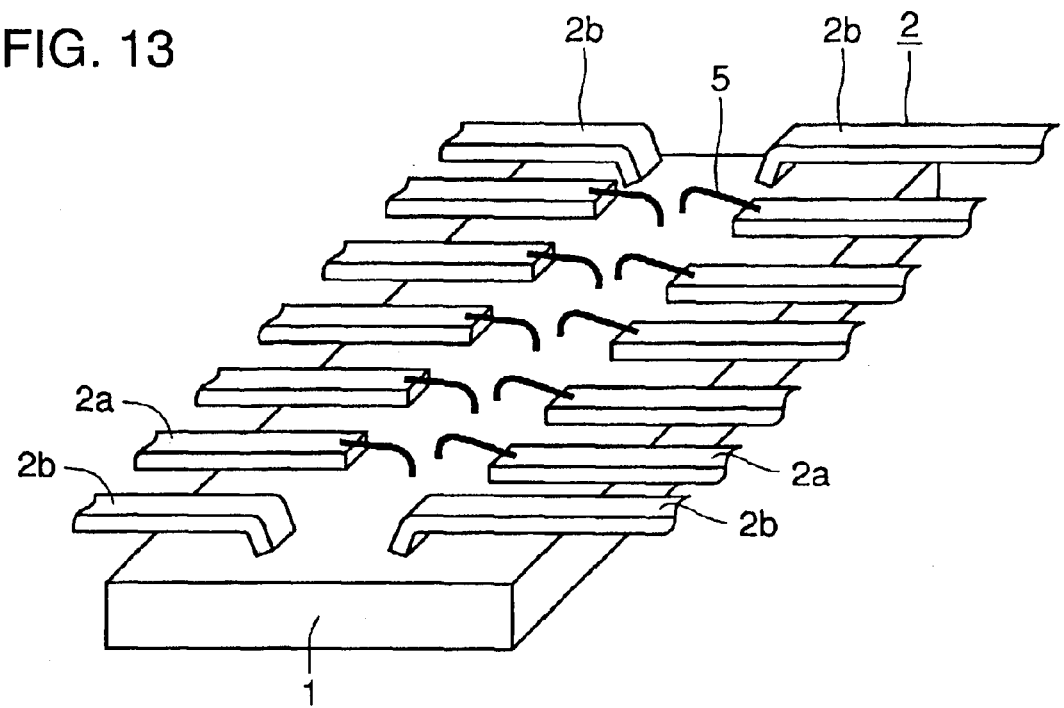
FIG. 13 is a partial perspective view of an LOC semiconductor device of a fourth modification of the second embodiment.
Figure 14:
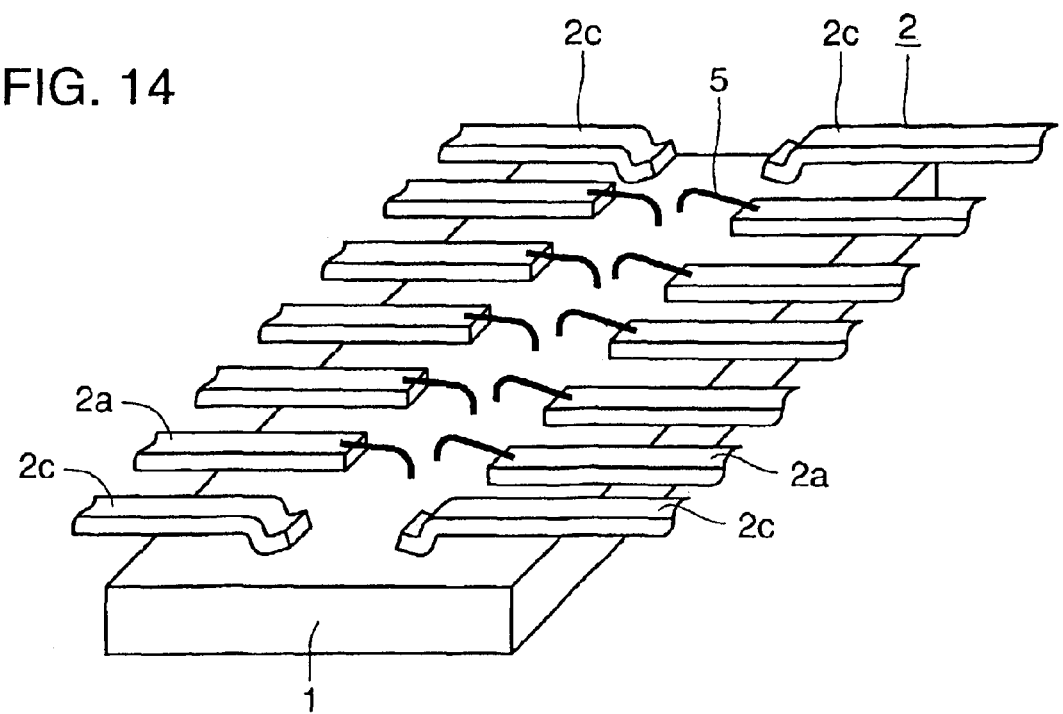
FIG. 14 is a partial perspective view of an LOC semiconductor device of a fifth modification of the second embodiment.

Then, the fourth modification of the LOC semiconductor device of this embodiment is described below. As shown in FIG. 13, the LOC semiconductor device of the fourth modification has four internal leads 2b shown in FIGS. 6 and 7 which are set to positions almost corresponding to four corners of the semiconductor chip 1. That is, four internal leads 2b are set to a position farthest from an injection port for injecting a mold resin and a position nearest to the injection port two each.

Similarly, in the case of the LOC semiconductor device of the fifth modification of this embodiment, internal leads 2c shown in FIGS. 8 and 9 are set to a position farthest from an injection port and a position nearest to the injection port two each.

Thus, in the case of the LOC semiconductor devices of the fourth and fifth modifications, internal leads contacting with the surface of the semiconductor chip 1 are set to a position farthest from an injection port and a position nearest to the injection port two each. Thereby, it is possible to most securely prevent the semiconductor chip 1 from approaching the internal lead 2a when injecting a mold resin.

Figure 15:
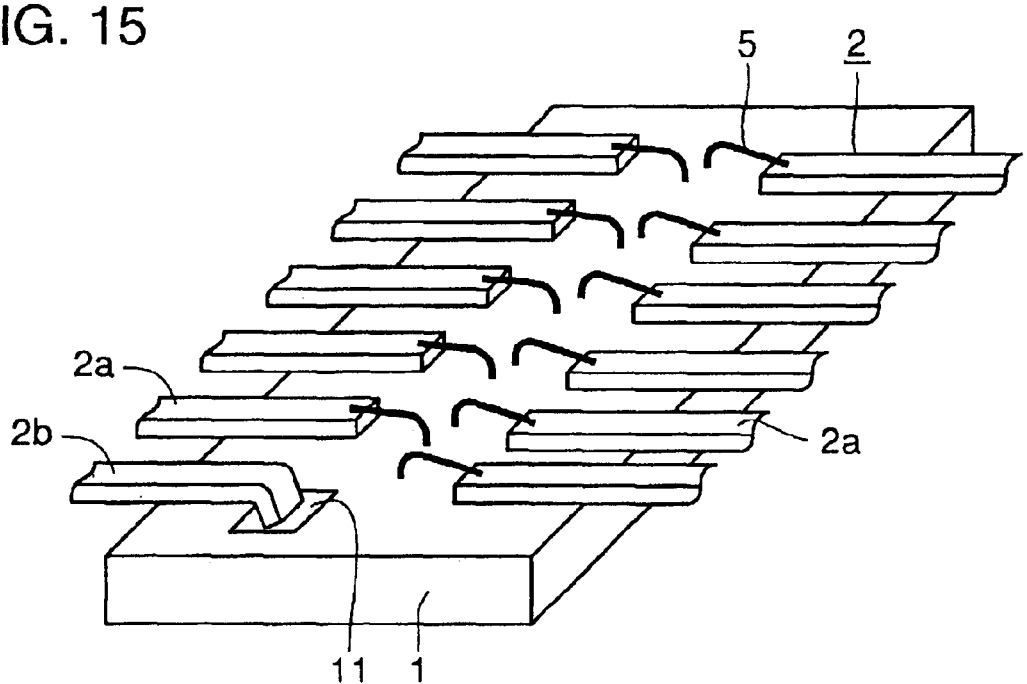
FIG. 15 is a partial perspective view of an LOC semiconductor device of a sixth modification of the second embodiment.
Figure 16:
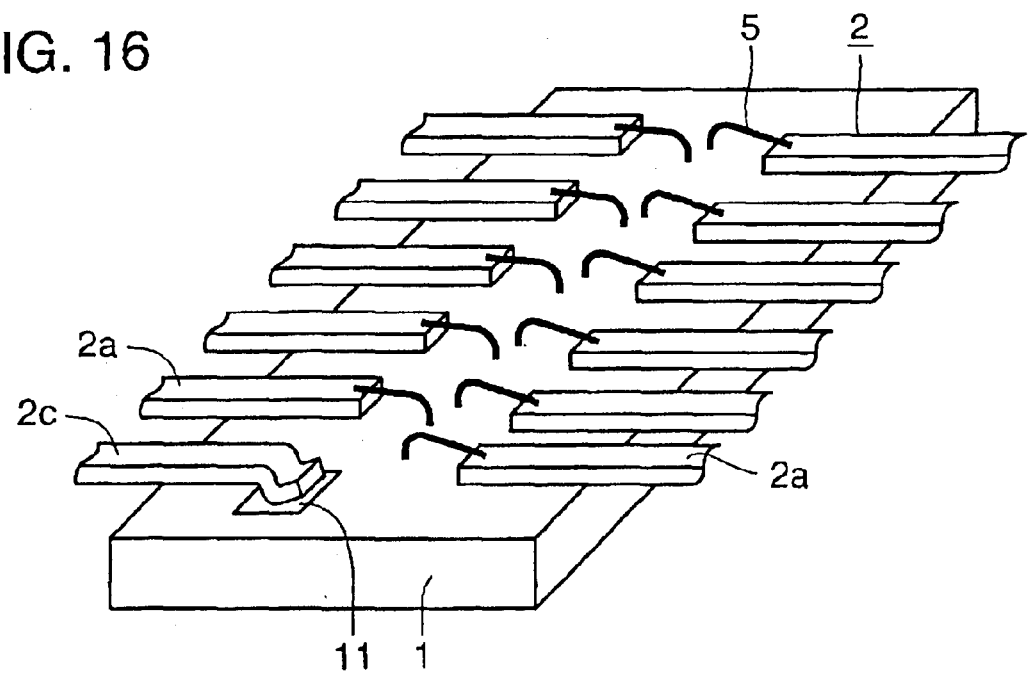
FIG. 16 is a partial perspective view of an LOC semiconductor device of a seventh modification of the second embodiment.

Then, the sixth modification of the LOC semiconductor device of this embodiment is described below. As shown in FIG. 15, in the case of the LOC semiconductor device of the sixth modification, tip ends of internal leads 2b shown in FIGS. 6 and 7 contact with a no-element-formed area 11 in which a semiconductor element is not formed on the surface of the semiconductor chip 1.

Similarly, in the case of the LOC semiconductor device of the seventh modification of this embodiment, tip ends of internal leads 2c shown in FIGS. 8 and 9 contact with a no-element-formed area 11 in which a semiconductor element is not formed on the surface of the semiconductor chip 1.

Thus, in the case of the LOC semiconductor devices of the sixth and seventh modifications, an internal lead contacts with the surface of the semiconductor chip 1 with no semiconductor element formed on it. Thereby, compared to the case in which an internal lead contacts with an area with an element formed in it, it is possible to control a semiconductor element and a circuit in its turn formed on the semiconductor chip 1 from being damaged.

Figure 17:
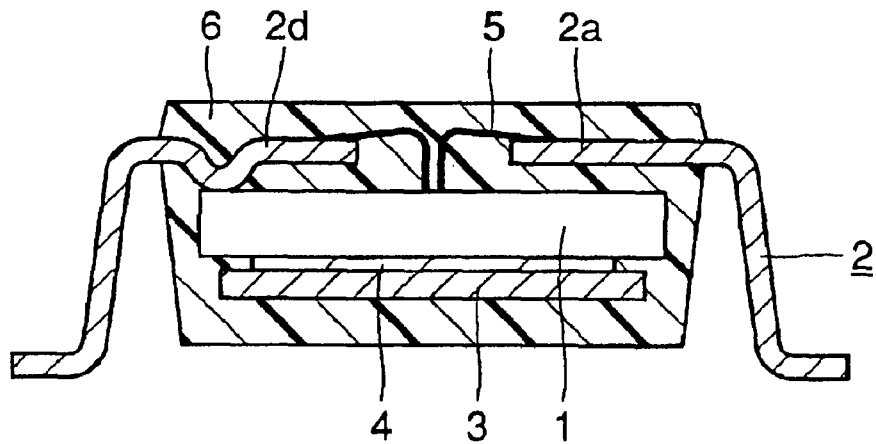
FIG. 17 is a sectional view of an LOC semiconductor device of an eighth modification of the second embodiment.
Figure 18:
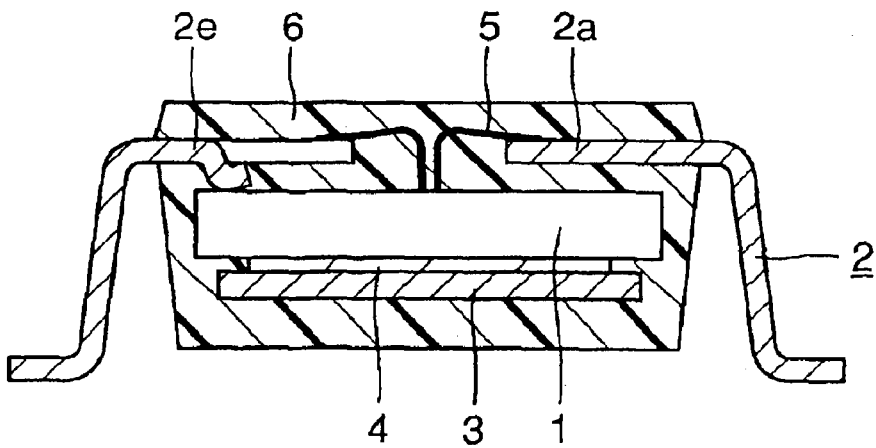
FIG. 18 is a sectional view of an LOC semiconductor device of a ninth modification of the second embodiment.

Moreover, in the case of the LOC semiconductor devices described above, the tip end of an internal lead is bent and contacts with the vicinity of a pad formed on the surface of a semiconductor chip. In addition to the above LOC semiconductor device, it may use the LOC semiconductor device such as that of the eighth modification shown in FIG. 17 and that of the ninth modification shown in FIG. 18 which is provided with internal leads 2d and 2e having bent portions contacting with positions corresponding to the peripheral portion of the semiconductor chip 1.

According to these LOC semiconductor devices, it is possible to securely prevent a circuit (not illustrated) formed on the surface of the semiconductor chip 1 from being damaged by bringing the predetermined internal leads 2d and 2e into contact with the peripheral portion of the semiconductor chip 1.

Third Embodiment

The LOC semiconductor device of the third embodiment and a lead frame used for the device of the present invention are described below.

Figure 19:
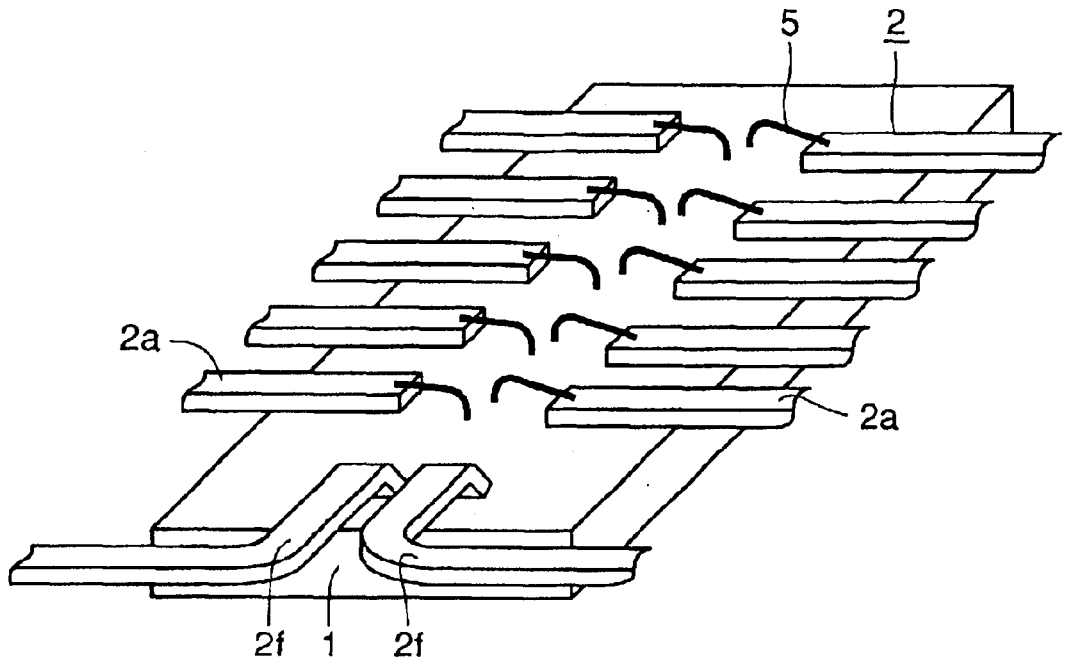
FIG. 19 is a partial perspective view of an LOC semiconductor device of a third embodiment of the present invention.
Figure 20:
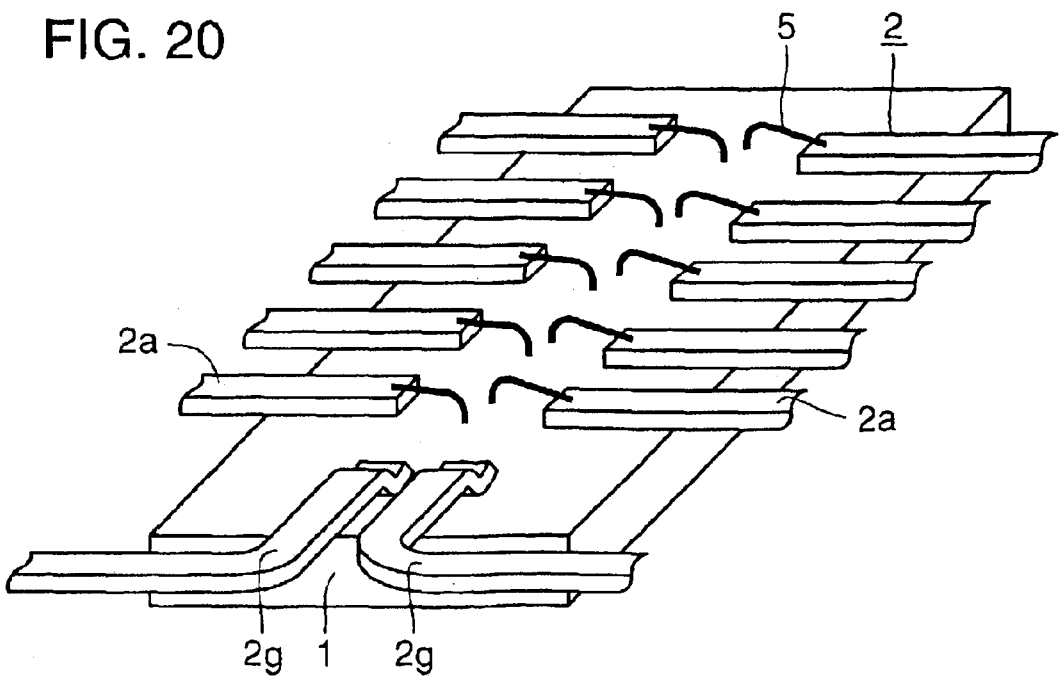
FIG. 20 is a partial perspective view of an LOC semiconductor device of a modification of the third embodiment of the present invention.

As shown in FIGS. 19 and 20, in the case of these LOC semiconductor devices, the lead 2 has internal leads 2f and 2g whose tip ends are bent. In the internal leads 2f and 2g, a portion extending in the direction almost orthogonal to the direction in which the internal lead 2a set on and wire-bonded to the surface of the semiconductor chip 1 extends contacts with the surface of the semiconductor chip 1.

Specifically, though the wire-bonded internal lead 2a is set to a major side of the almost-rectangular semiconductor chip 1, the internal leads 2f and 2g are arranged at minor sides of the semiconductor chip 1 which are the opposite side to the injection port for injecting a mold resin. Thereby, as described for the second embodiment, it is possible to effectively prevent the semiconductor chip 1 from approaching the internal lead 2.

Figure 21:
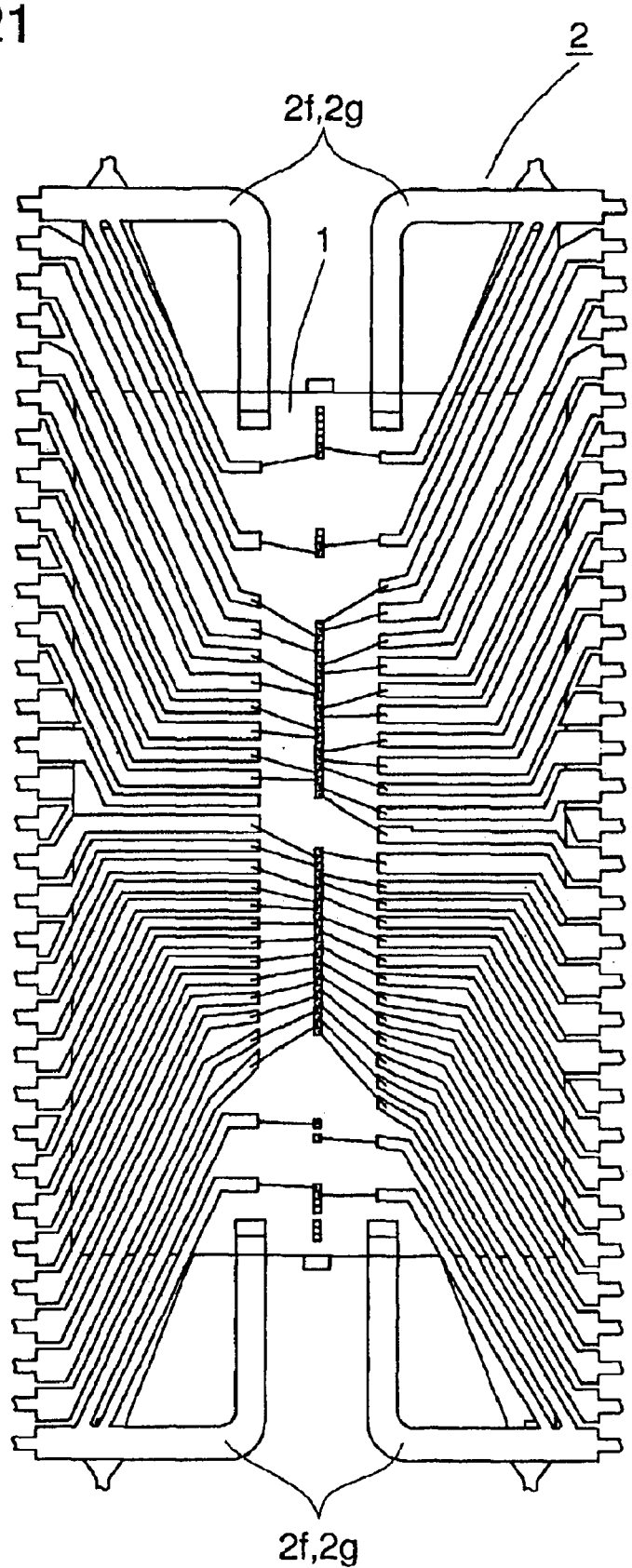
FIG. 21 is an illustration showing a planar pattern of leads used for the LOC semiconductor device of the third embodiment.

Particularly, as shown in FIG. 21, in the case of the LOC semiconductor device, it is permitted that the lead frame 2 used has internal leads 2f and 2g approaching the surface of a semiconductor chip separately from a group of internal leads to be wire-bonded each other. In this case, it is possible to more improve the degree of freedom of an arrangement pattern of internal leads to be wire-bonded of a lead frame compared with the lead frame shown in FIG. 10.

Fourth Embodiment

The LOC semiconductor device of the fourth embodiment of the present invention is described below. In the case of the LOC semiconductor devices described for the second and third embodiments, the interval between a specific internal lead and a semiconductor chip is kept by bringing the internal lead into contact with the semiconductor chip.

Figure 22:
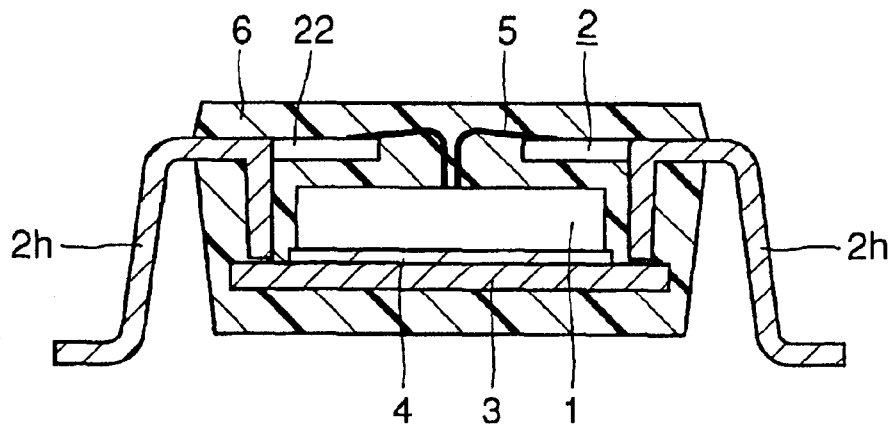
FIG. 22 is a sectional view of an LOC semiconductor device of a fourth embodiment of the present invention.
Figure 23:
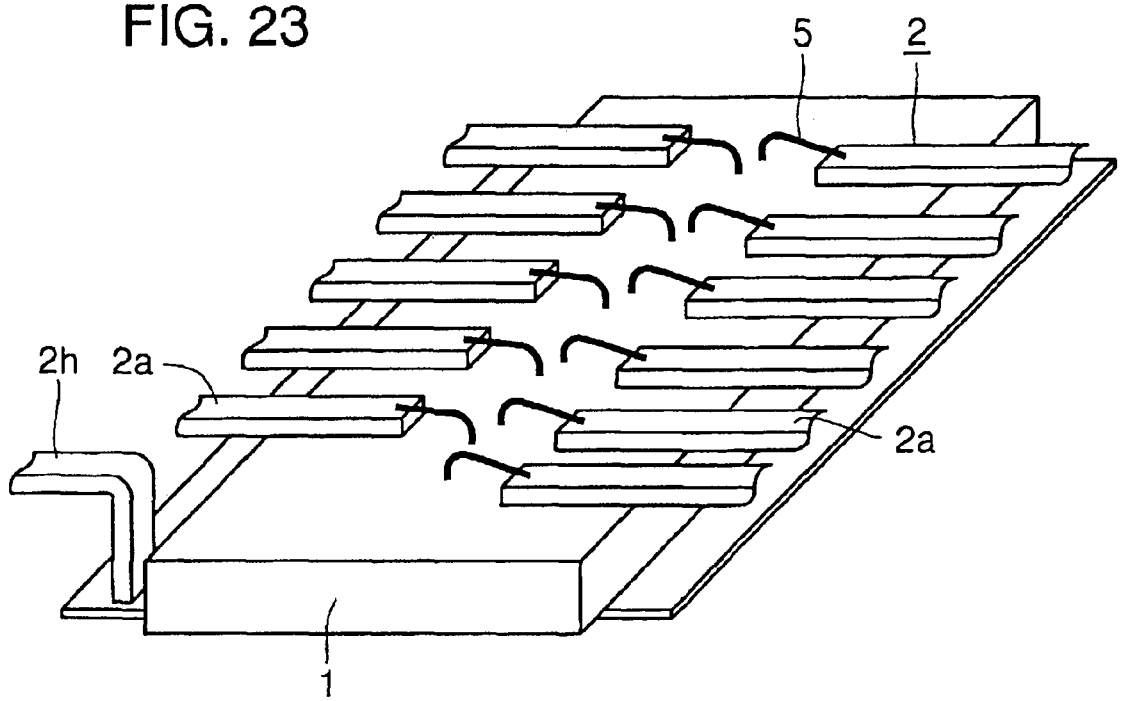
FIG. 23 is a partial sectional view of the LOC semiconductor device shown in FIG. 22 of the fourth embodiment.

In the case of the LOC semiconductor device of the fourth embodiment, as shown in FIGS. 22 and 23, an internal lead 2h is set so that the tip end of the internal lead 2h contacts with a major side of a die pad 3 mounting a semiconductor chip 1. Therefore, to bring the internal lead 2h into contact with the major side of the die pad 3, minor sides of the die pad 3 are longer than minor sides of the semiconductor chip 1.

However, major sides of the die pad 3 are set so as to be longer than major sides of the semiconductor chip 1. This is for shifting the semiconductor chip 1 toward the internal lead 2h by making major sides of the die pad 3 parallel to major sides of the semiconductor chip 1 shorter than major sides of the semiconductor chip 1 because minor sides of the die pad 3 are longer than those of the semiconductor chip 1 and thereby, decreasing the flow resistance of a mold resin flowing through the lower side of the semiconductor chip 1 when injecting the mold resin and making the flow of the mold resin at this portion higher than the flow of the mold resin at the upper side of the semiconductor chip 1. That is, the above mentioned is performed in order to prevent the semiconductor chip 1 from shifting in the direction going away from the internal lead 2h when injecting a mold resin into a mold.

According to the LOC semiconductor device, because the tip end of the internal lead 2h contacts with the die pad 3 mounting the semiconductor chip 1, the surface of the semiconductor chip 1 is not damaged.

It is preferable to use a lead frame in which a series of internal leads to be wire-bonded are arranged or internal leads contacting a die pad are arranged as a lead frame used for an LOC semiconductor device.

Figure 24:
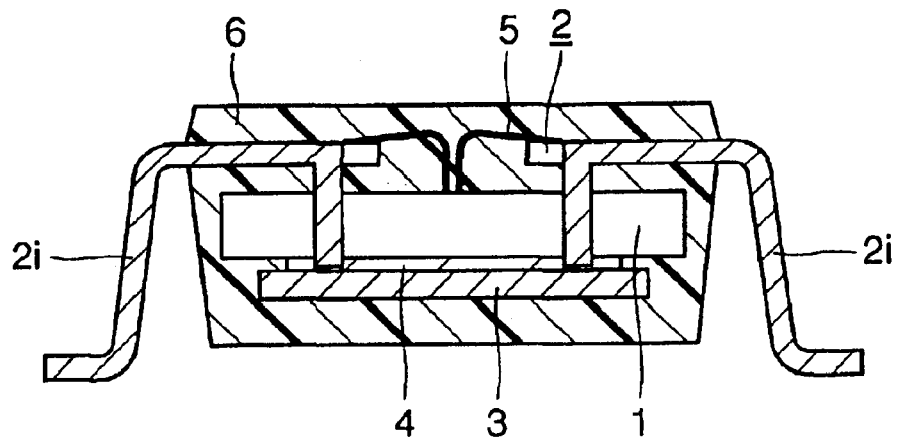
FIG. 24 is a sectional view of an LOC semiconductor device of a modification of the fourth embodiment.
Figure 25:
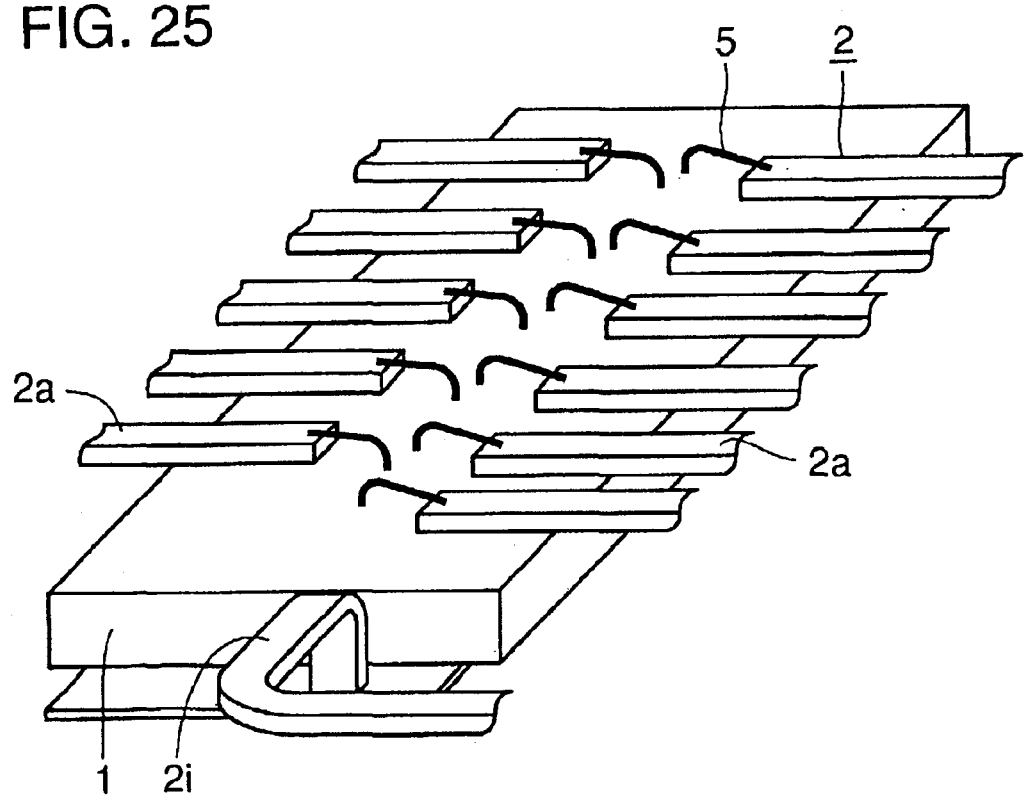
FIG. 25 is a partial perspective view of the LOC semiconductor device shown in FIG. 24 of the fourth embodiment.

Then, a modification of the LOC semiconductor device of this embodiment is described below. As shown in FIGS. 24 and 25, in the LOC semiconductor device of the modification, an internal lead 2i is set so that the tip end of the internal lead 2i contacts with a minor side of a die pad 3 mounting a semiconductor chip 1. Thus, to bring the internal lead 2i into contact with a minor side of the die pad 3, major sides of the die pad 3 are made longer than those of the semiconductor chip 1.

However, minor sides of the die pad 3 are set so as to be shorter than those of the semiconductor chip 1. This is for shifting the semiconductor chip 1 toward the internal lead 2i by making minor sides of the die pad 3 shorter than those of the semiconductor chip 1 because major sides of the die pad 3 are longer than those of the semiconductor chip 1, thereby decreasing the flow resistance of a mold resin flowing through the lower side of the semiconductor chip 1 when injecting the mold resin, and making the flow of the mold resin at this portion higher than the flow of the mold resin at the upper side of the semiconductor chip 1.

Also, this LOC semiconductor device prevents the surface of the semiconductor chip 1 from being damaged because the tip end of the internal lead 2i contacts with the die pad 3.

Moreover, it is preferable to use a lead frame in which internal leads contacting with a die pad are arranged separately from a series of internal leads to be wire-bonded as a lead frame used for the above LOC semiconductor device as shown in FIG. 21.

Fifth Embodiment

The LOC semiconductor device of the fifth embodiment of the present invention is described below. The LOC semiconductor device described for the fourth embodiment holds the interval between a specific internal lead and a semiconductor chip by bringing the internal lead into contact with a die pad on which the semiconductor chip is mounted.

Figure 26:
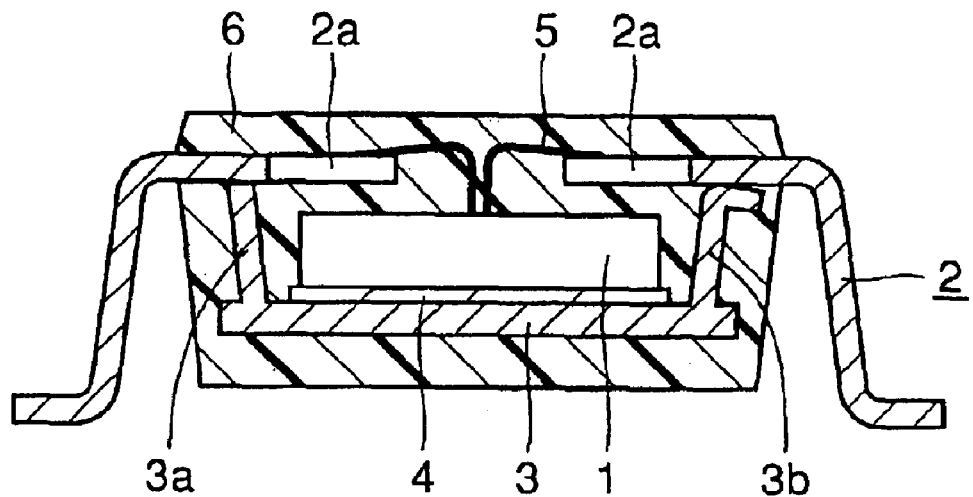
FIG. 26 is a sectional view of an LOC semiconductor device of a fifth embodiment of the present invention.

As shown in FIG. 26, the LOG semiconductor device of this embodiment is constituted so that tip ends of protrusions 3a and 3b formed on a die pad 3 contact with an internal lead 2a. Particularly, the protrusions 3a and 3b are arranged at a major side of a semiconductor chip 1 (in the direction almost orthogonal to the paper surface) and contact with the internal lead 2a. Thus, to form the protrusions 3a and 3b contacting with the internal lead on the die pad 3, minor sides of the die pad 3 are longer than those of the semiconductor chip 1.

However, lengths of sides of the die pad 3 parallel to major sides of the semiconductor chip 1 are set so as to be shorter than major sides of the semiconductor chip 1. As described for the fourth embodiment, this is for shifting the semiconductor chip 1 toward the internal lead 2a by making major sides of the die pad 3 longer than those of the semiconductor chip 1 because minor sides of the die pad 3 are longer than those of the semiconductor chip 1, and thereby decreasing the flow resistance of a mold resin flowing through the lower side of the semiconductor chip 1 when injecting the mold resin, and making the flow of the mold resin at this portion higher than the flow of the mold resin at the upper side of the semiconductor chip 1.

According to this LOC semiconductor device, the surface of the semiconductor chip 1 is not damaged because the tip end of the protrusion 3c contacts with the internal lead 2a. To bring the protrusions 3a and 3b into contact with the internal lead 2a, the tip end of the protrusion 3a may be brought into contact with the internal lead 2a the bent crest portion of the protrusion 3b may be brought into contact with the internal lead 2a.

Figure 27:
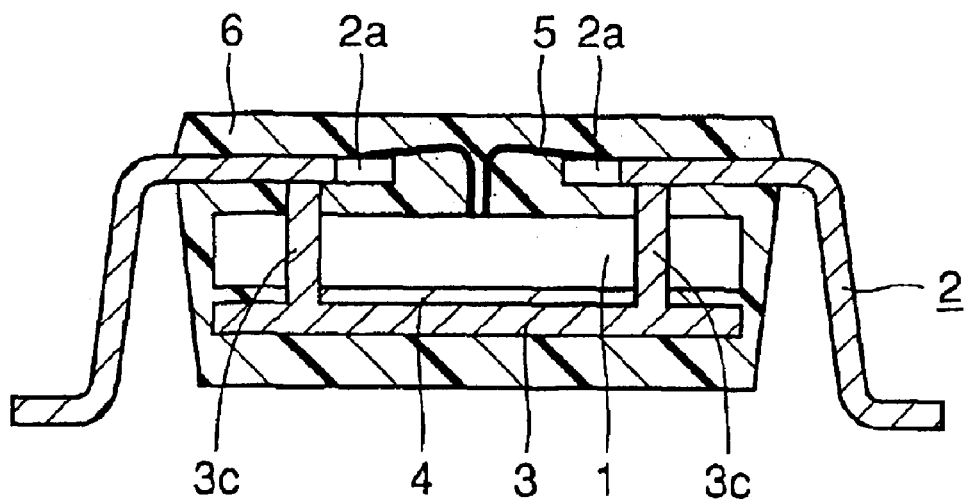
FIG. 27 is a sectional view of an LOC semiconductor device of a modification of the fifth embodiment.
Figure 28:
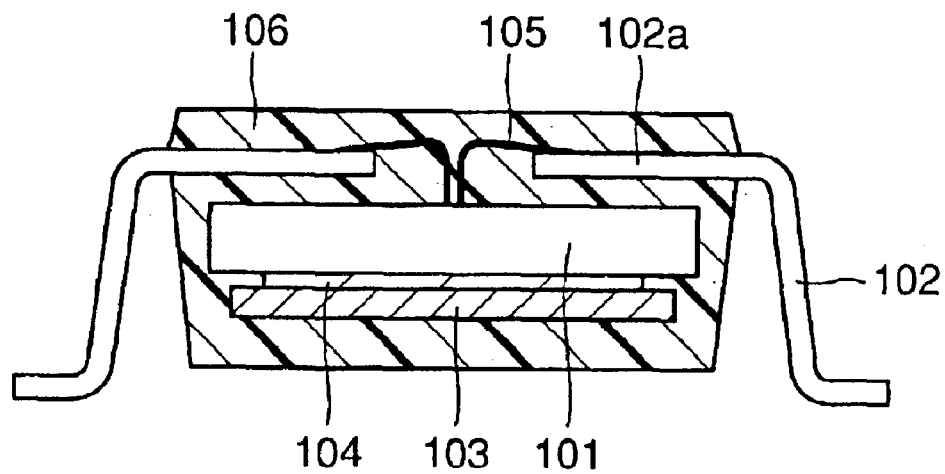
FIG. 28 is a sectional view of a conventional LOC semiconductor device.
Figure 29:
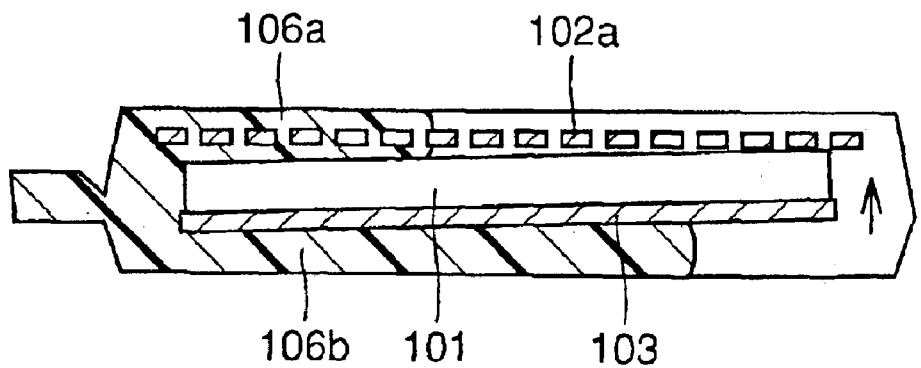
FIG. 29 is a sectional view for explaining problems of a step of injecting a resin into a mold.
Figure 30:
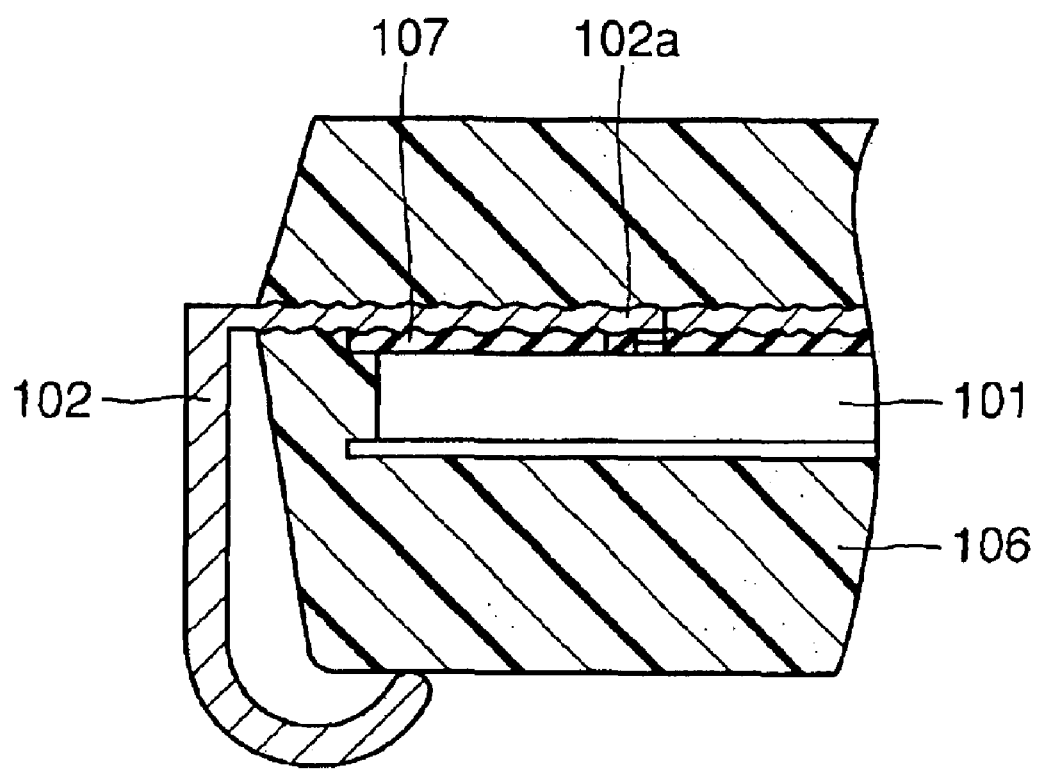
FIG. 30 is a sectional view of another conventional LOC semiconductor device.

Then, a modification of the LOC semiconductor device of this embodiment is described below. As shown in FIG. 27, the LOC semiconductor device of the modification is constituted so that the tip end of the protrusion 3c formed on the die pad 3 contacts with the internal lead 2a. Particularly, the protrusion 3c is formed on a minor side of the semiconductor chip 1 (in the direction almost parallel with the paper surface) and contacts with the internal lead. Therefore, to form the protrusion 3c contacting with the internal lead 2a on the die pad 3, major sides of the die pad 3 are made longer than those of the semiconductor chip 1.

However, minor sides of the die pad 3 is set so as to be shorter than those of the semiconductor chip 1. This is for shifting the semiconductor chip 1 toward the internal lead by making minor sides of the die pad 3 shorter than minor sides of the semiconductor chip 1 because major sides of the die pad 3 are longer than those of the semiconductor chip 1, thereby decreasing the flow resistance of a mold resin flowing through the lower side of the semiconductor chip 1 when injecting the mold resin, and making the flow of the mold resin at this portion higher than the flow of the mold resin at the upper side of the semiconductor chip 1 as described above.

According to this LOC semiconductor device, the surface of the semiconductor chip 1 is not damaged because the tip end of the protrusion 3c contacts with the internal lead.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A sealed semiconductor device comprising:

a semiconductor chip;

a lead frame including internal leads, a plurality of said internal leads extending across part of and spaced from a surface of said semiconductor chip; and a die pad separate from and not connected to said lead frame and on which said semiconductor chip is mounted, wherein at least one of said internal leads extends substantially perpendicular to and contacts said die pad but is not bonded to said die pad.

2. The sealed semiconductor device according to claim 1, wherein said at least one internal lead perpendicular to and contacting said die pad is peripheral to and does not contact said semiconductor chip.

3. The lead frame according to claim 1, wherein said die pad is substantially rectangular and includes a pair of longer sides and a pair of shorter sides and said at least one internal lead perpendicular to and contacting said die pad extends proximate the pair of longer sides of said die pad.

4. The lead frame according to claim 1, wherein said die pad is substantially rectangular and includes a pair of longer sides and a pair of shorter sides and said at least one internal lead perpendicular to and contacting said die pad extends proximate the pair of shorter sides of said die pad.

5. A seated semiconductor device comprising:

a semiconductor chip;

a lead frame including internal leads extending across part of and spaced from a surface of said semiconductor chip, and a die pad separate from and not connected to said lead frame and on which said semiconductor chip is mounted, said die pad including fixed protrusions extending toward and contacting some of said internal leads.

6. The sealed semiconductor device according to claim 5 wherein said fixed protrusions prevent said internal leads from contacting said semiconductor chip.

7. A sealed semiconductor device comprising:

a semiconductor chip;

a die pad on which said semiconductor chip is mounted;

a lead frame including internal leads extending across part of and spaced from a surface of said semiconductor chip; and a tape including four tape members located at respective corners of said semiconductor chip, each tape member being disposed between said semiconductor chip and some of said internal leads, holding said semiconductor chip and said internal leads at a fixed distance from each other, each of said tape members having a first surface to which some of said internal leads are bonded and fixed, and a second surface in contact with but not adhered to the surface of said semiconductor chip, only a portion of the second surface of each of said tape members contacting the surface of said semiconductor chip.

8. The sealed semiconductor device according to claim 7, wherein each of said tape members is disposed on the surface of said semiconductor chip so that a portion of each tape member protrudes beyond at least one edge of the surface of said semiconductor chip.

9. A lead frame and tape for a sealed semiconductor device having a rectangular semiconductor chip sealed within an encapsulating resin, said lead frame and tape comprising:

a semiconductor chip;

a die pad on which said semiconductor chip is mounted;

internal leads extending toward and electrically connected with wires to respective pads located approximately along a central axis of said semiconductor chip; and a tape including four tape members, each tape member having a first surface to which some of said internal leads are fixed, each of said tape members being arranged at a respective corner of said semiconductor chip so that only a portion of a second surface of each of said tape members contacts but is not adhered to a surface of said semiconductor chip when said semiconductor chip is sealed within the encapsulating resin.

10. The lead frame and tape for a sealed semiconductor device according to claim 9, wherein each of said tape members is disposed on the surface of said semiconductor chip so that a portion of each tape member protrudes beyond at least one edge of the surface of said semiconductor chip.

* * * * *